United States Patent [19]

Katayama et al.

[11] Patent Number: 5,499,668
[45] Date of Patent: Mar. 19, 1996

[54] PROCESS FOR MAKING ELECTRONIC DEVICE

[75] Inventors: Kaoru Katayama; Shinichi Kazui; Yasuhiro Iwata; Hiroshi Fukuda; Toshihiko Ohta, all of Hadano, Japan

[73] Assignee: Hitachi, Ltd., Tokyo, Japan

[21] Appl. No.: 330,380

[22] Filed: Oct. 27, 1994

[30] Foreign Application Priority Data

Nov. 2, 1993 [JP] Japan ................................. 5-274421
Oct. 4, 1994 [JP] Japan ................................. 6-239813

[51] Int. Cl.[6] ................................................. B08B 3/12
[52] U.S. Cl. ............................... 134/1; 134/2; 228/205
[58] Field of Search .................... 134/1, 2; 228/205; 219/121.6, 121.85

[56] References Cited

U.S. PATENT DOCUMENTS

| | | | |
|---|---|---|---|
| 4,898,650 | 2/1990 | Wu et al. | 204/29 |
| 5,024,968 | 1/1991 | Engelsberg | 437/173 |
| 5,151,135 | 9/1992 | Magee et al. | 134/1 |
| 5,328,517 | 7/1994 | Cates et al. | 134/7 |

FOREIGN PATENT DOCUMENTS

| | | |
|---|---|---|
| 62-256961 | 11/1987 | Japan . |
| 63-97382 | 4/1988 | Japan . |
| 0001400 | 4/1983 | WIPO ..................................... 134/18 |

*Primary Examiner*—John Sheehan
*Attorney, Agent, or Firm*—Fay, Sharpe, Beall, Fagan, Minnich & McKee

[57] ABSTRACT

Oxide films, and residues of organic matters, carbons, if any, are removed from a metal surface simply without using complicated steps and without giving adverse effects on electronic parts or electronic devices by irradiating the metal surface with a laser beam of lower energy level than energy capable of changing the metal surface structure, thereby cleaning the metal surface.

10 Claims, 10 Drawing Sheets

PROCESS FOR MAKING ELECTRONIC DEVICE

BACKGROUND OF THE INVENTION

1. Field of the Invention

The present invention relates to a process for metal surface treatment, and more particularly to an effective process for removing an oxide film, and residues of organic matters, carbon, etc., if any, from a solder surface or a metal surface to be treated, when, for example, a circuit wiring substrate and a semiconductor integrated circuit (LSI) or the like are bonded to each other by soldering, or when plating is applied to a metal surface.

2. Related Art

Heretofore, it has been required that, when a circuit wiring substrate and a semiconductor integrated circuit or the like are bonded to each other by soldering, the surfaces of metal to be bonded be kept clean and there be no solder wettability-inhibiting substances. Furthermore, it has been also required that there be no oxide film, etc. on the surface of metal to be plated and the surface of the metal be kept clean. When an Au wire or ribbon is bonded to the metal surface by ultrasonic welding, the presence of an oxide film on the surface of the metal is a serious problem, and thus the surface of the metal must be kept clean.

Such solder wettability-inhibiting substances include, for example, oxides, chlorides, sulfides, carbonates, and organic compounds. Particularly in the processes for soldering, plating, or bonding of an Au wire or ribbon by ultrasonic welding, most serious inhibiting substance is an oxide film existing on the surface of such metal to be treated, as solder, nickel (Ni), nickel alloys (alloys of nickel with other element or elements).

Generally, the oxide film is chemically converted to a liquid compound by a flux, whereby the metal atoms of the surface of the metal and the metal atoms of a solder have a chance of direct collisions to each other for forming a metal bond by shearing of their outer electron orbits to form an alloy.

In the case of plating, it is impossible to conduct plating if there is an oxide film on the metal surface. For example, in the case of electroplating, which is typical of the plating, the oxide film acts as an insulating film and inhibits the necessary electrical conduction for electroplating, resulting in a failure to conduct plating.

In the case of substitution plating, the oxide film also acts as an inhibitor and there occurs no substitution reaction between the surface of metal to be treated and a plating solution, resulting in a failure to conduct plating.

The oxide film can be removed by treating the surface of the metal with hydrochloric acid or the like before the plating, but hydrochloric acid or the like remains as residues on the treated surface and such residues serve to be a factor of lowering the bonding reliability. Thus, washing of the surface of metal with flons (fluorocarbons) has been so far carried out after the treatment with an acid.

Recently, it has been proposed to use a very small amount of abietic acid (rosin) and adipic acid or the like as a flux without any after-washing of flux residues, but the proposed process is still not satisfactory in the bonding reliability [see "Alumit Technical Journal 19" (1992) and an article "Working mechanism and problems of flux for unnecessitating washing" by N. Kubota of K.K. Nihon Kogyo Gizyutsu-kaihatsu Kenkusho (Industrial Technology Development Research Institute of Japan, Ltd.)].

On the other hand, a glazing process for irradiating the surfaces of a metallic materials, steel, carbides, etc. with a laser beam, thereby producing materials having a uniform microfine structure or amorphous structure and good corrosion resistance and wear resistance has been proposed and has been applied to processing of metallic materials to be exposed to high temperature and high pressure, such as materials for automobile turbines [see "Laser Processing" (continued part), page 164, by A. Kobayashi, published by Kaihatsu-sha].

It has been also proposed to remove oxide films from metal surfaces by argon sputtering without using any flux or hydrochloric acid.

Furthermore, it has been proposed to form a coating film having a good adhesion without pinholes by roughening a metal surface by blasting, plating the roughened metal surface with an alloy element and then irradiating the plating layer with a laser beam, thereby melting the plating layer (JP-A-63-97382).

Still furthermore, it has been proposed to form a surface layer having a good corrosion resistance and a ready susceptibility to soldering by forming an anodized oxide film on the surface of aluminum or its alloys (JP-A-62-256961).

As a result of extensive study of the above-mentioned prior art, the present inventors have found the following problems:

(1) When a circuit substrate and an integrated circuit or the like as to be bonded to each other by soldering, an oxide film must be removed from their surfaces by a flux before the soldering, and the resulting flux residues must be washed off from their surfaces. In the case of removing oxide films from metal surfaces by washing with an acid before the plating, the resulting acid residues or the metal surfaces cause a later corrosion. Furthermore, an additional drying step is imperative after the washing.

(2) When oxide films are removed from metal surfaces by argon sputtering, the sputtering must be carried out in vacuum. Thus, an additional sputtering apparatus and its complicated operation control are required. There is also such a problem that the argon sputtering has an adverse effect on working elements of electronic parts or electronic devices.

(3) In the glazing process using a laser beam and the laser irradiation process disclosed in the above-mentioned JP-A-63-97382, the surface metal structure is forcedly changed by irradiation with a laser beam of higher energy level and by the resulting melting, thereby endowing a high wear resistance and a high compactness to the metal surface, but an oxide film is inevitably formed on the metal surface in the course of metal surface solidification.

(4) The surface treatment disclosed in the above-mentioned JP-A-62-256961 does not relate to an oxide film-removing technique.

SUMMARY OF THE INVENTION

An object of the present invention is to provide a process for metal surface treatment for cleaning a metal surface, that is, removing an oxide film and residues of organic matters, carbon, etc., if any, from the metal surface simply without using any complicated steps and without giving any adverse effects on electronic parts or electronic devices.

Other objects of the present invention will be apparent from disclosures which follow and the accompanying drawings.

According to the present invention, there is provided (1) a process for metal surface treatment, which comprises irradiating a surface of metal with a laser beam of lower energy level than energy level capable of changing the metal surface structure, thereby cleaning the surface of metal, wherein (2) the laser beam has a pulse span of not more than 1 µs; (3) the laser beam has a wavelength of 150 nm to 400 nm; (4) the metal is one of solder, nickel and nickel alloys, where (5) the laser beam has an energy density of 0.5 J/cm$^2$ to 4.0 J/cm$^2$; and (6) a reoxidation-preventing plating layer is formed on the cleaned metal surface after the irradiation of the surface of metal by the laser beam.

In the present invention, a metal surface to be treated is irradiated with a laser beam of lower-energy level than energy level capable of changing the metal surface structure. More particularly, irradiation is carried out with a laser beam of higher energy level than the bonding energy between metal atoms and oxygen atoms on the metal surface, but of lower energy level than the bonding energy between the metal atoms themselves, whereby only the bonding between the metal atoms and the oxygen atoms on the metal surface is dissociated and the oxide film is removed from the metal surface, and at the same time residues of organic matters, carbon, etc., if any, is removed from the metal surface. That is, the metal surface can be cleaned thereby.

That is, the main purpose of irradiation with a laser beam is to dissociate bonding between the metal atoms and the oxygen atoms on the metal surface, and it is preferable to use a pulse laser beam having a pulse span of not more than 1 µs. Since the bonding between the metal atoms and the oxygen atoms on the metal surface is dissociated by a pulse laser beam having a pulse span of not move than 1 µm, it is preferable to use, for example, an eximer laser having a short wavelength (that is, a high level of photon energy) as a laser beam.

Atmosphere for irradiation with the laser beam can be any one of atmospheric air, vacuum and a He gas atmosphere, where the oxide films can be removed from the metal surfaces without any problems.

DESCRIPTION OF PREFERRED EMBODIMENTS

The present invention will be described in detail below, referring to Examples and Drawings, where members having the same functions are identified by the same numerals throughout the drawings explaining Examples of the present invention to omit repeated explanation.

Figure 1:
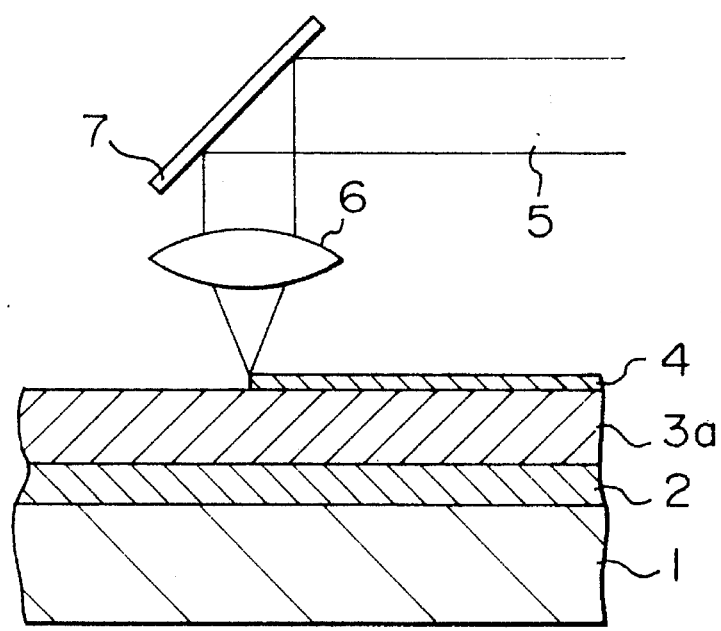
FIG. 1 is a vertical cross-sectional view explaining the present process for metal surface treatment according to Example 1 of the present invention.

FIG. 1 is a vertical cross-sectional view explaining the present process for metal surface treatment, where an oxide film 4 (and residues of organic matters, carbon, etc., if any) is removed from the surface of a solder layer 3a on the metallized layer 2 formed as an overlayer on a ceramic substrate 1. The metallized layer 2 is a film of, for example, titanium (Ti), nickel (Ni), nickel alloy or the like.

Oxide film 4 (and residues of organic matters, carbon, etc., if any) can be removed from the surface of solder layer 3a on the metallized layer 2 by irradiation of the surface of solder layer 3a with a laser beam 5 reflected on a mirror 7 and passing through a lens 6.

Figure 2:
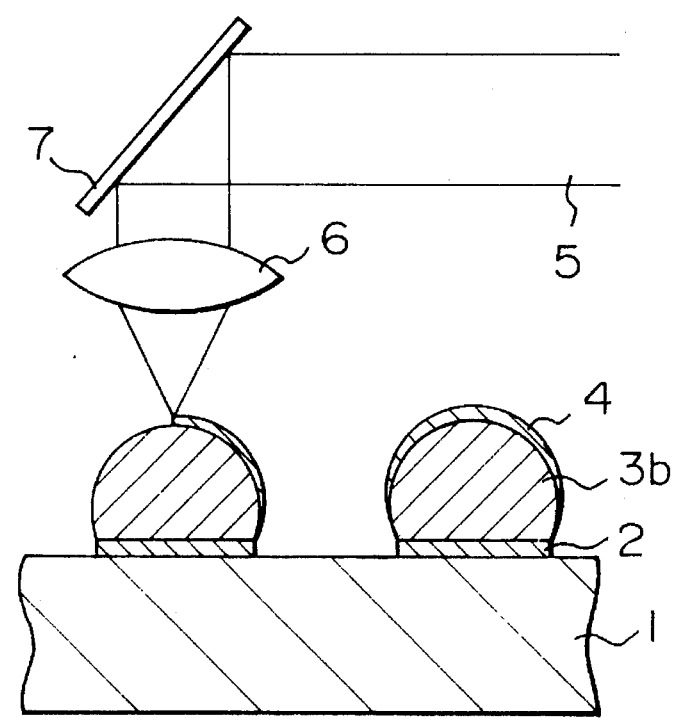
FIG. 2 is a vertical cross-sectional view explaining one modification of Example 1 of the present invention, i.e. irradiation of solder bump surface with a laser beam reflected on a mirror and passing through a lens in making of electronic devices such as semiconductor integrated circuits (LSI) in place of the solder layer shown in FIG. 1.

FIG. 2 shows a modification of the above-mentioned embodiment shown in FIG. 1, where the surface of solder bump 3b is irradiated with a laser beam 5 reflected on the mirror 7 and passing through the lens 6 in making of electronic devices such as semiconductor integrated circuits (LSI) in place of the solder layer 3a shown in FIG. 1.

Laser beam 5 used in Example 1 is a laser beam having a lower energy level than energy level capable of changing the metal structure of solder layer 3a or solder bump 3b, and more particularly is a laser beam having an energy level higher than the bond energy between Sn—Pb atoms and O atoms on the surface of solder layer 3a or solder bump 3b, but lower than the bond energy between Sn—Pb atoms themselves.

When the surface of solder layer 3a or solder bump 3b is irradiated with laser beam 5, only bonding between Sn—Pb atoms and O atoms on the surface is dissociated by the energy of laser beam 5 without melting the solder layer 3a or solder bump 3b, and thus oxide film 4 can be removed from the surface of solder layer 3a or solder bump 3b. At the same time, residues of organic matters, carbon, etc. if any, can be removed from the metal surface.

In this case, the main purpose of irradiation with a laser beam 5 is to dissociate the bonding between the Sn—Pb atoms and the oxygen atoms on the surface, and thus preferable laser beam 5 is a pulse laser beam having a pulse span of not more than 1 µs. Furthermore, since the bonding between the Sn—Pb atoms and the O atoms on the surface is dissociated by a pulse laser beam having a pulse span of not more than 1 µs, for example, a eximer laser having a short wavelength (high photon energy level) is preferable as a laser beam 5.

Atmosphere for irradiation with laser beam 5 is any one of atmospheric air, vacuum and a He gas atmosphere, where the oxide film 4 can be removed from the surface of solder layer 3a or solder bump 3b.

Figure 3:
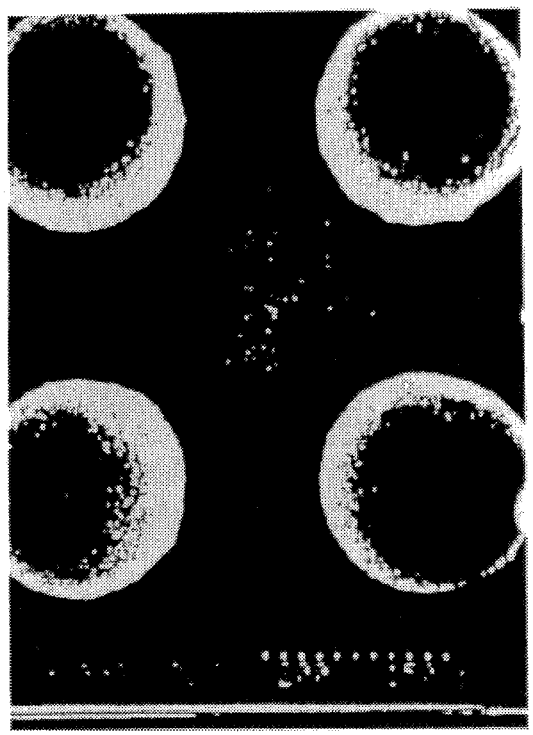
FIG. 3 is a picture of the solder layer surface of Example 1 of the present invention before the irradiation with a laser beam, taken by a scanning electron microscope.
Figure 4:
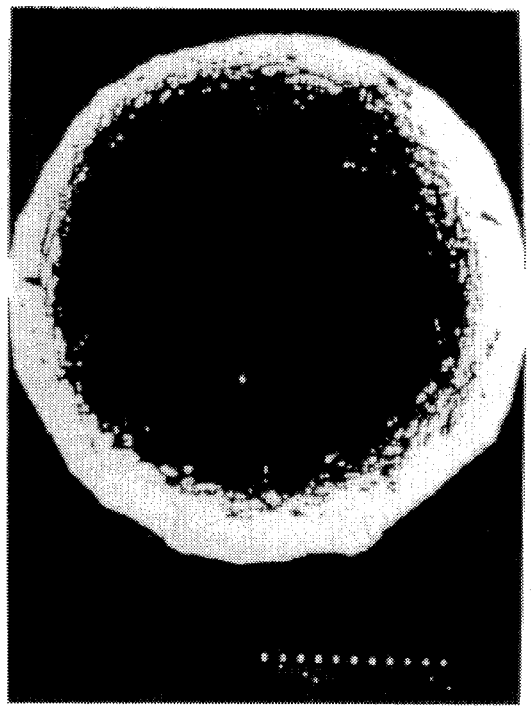
FIG. 4 is an enlarged picture of FIG. 3.

FIG. 3 is a picture of the surface state of solder layer 3a or solder bump 3b before irradiation with a laser beam, taken by a scanning electron microscope, and FIG. 4 is an enlarged picture of FIG. 3, from which oxide films and residues of organic matters, carbon, etc. are found as black residues on the surfaces of solder layer 3a or bump 3b.

Figure 5:
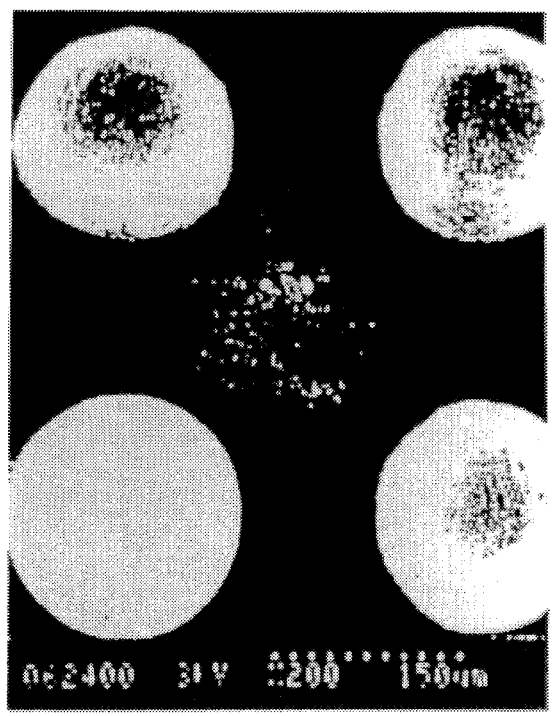
FIG. 5 is a picture of the solder layer surface of Example 1 of the present invention after the irradiation with the laser beam, taken by the scanning electron microscope.
Figure 6:
FIG. 6 is an enlarged picture of FIG. 5.

FIG. 5 is a picture of the surface state of solder layers 3a or solder bumps 3b after irradiation with a laser beam, taken also by the scanning electron microscope and FIG. 6 is an enlarged picture of FIG. 5, from which oxide films and residues of organic matters, carbon, etc. are substantially completely removed from the surface.

Figure 7:
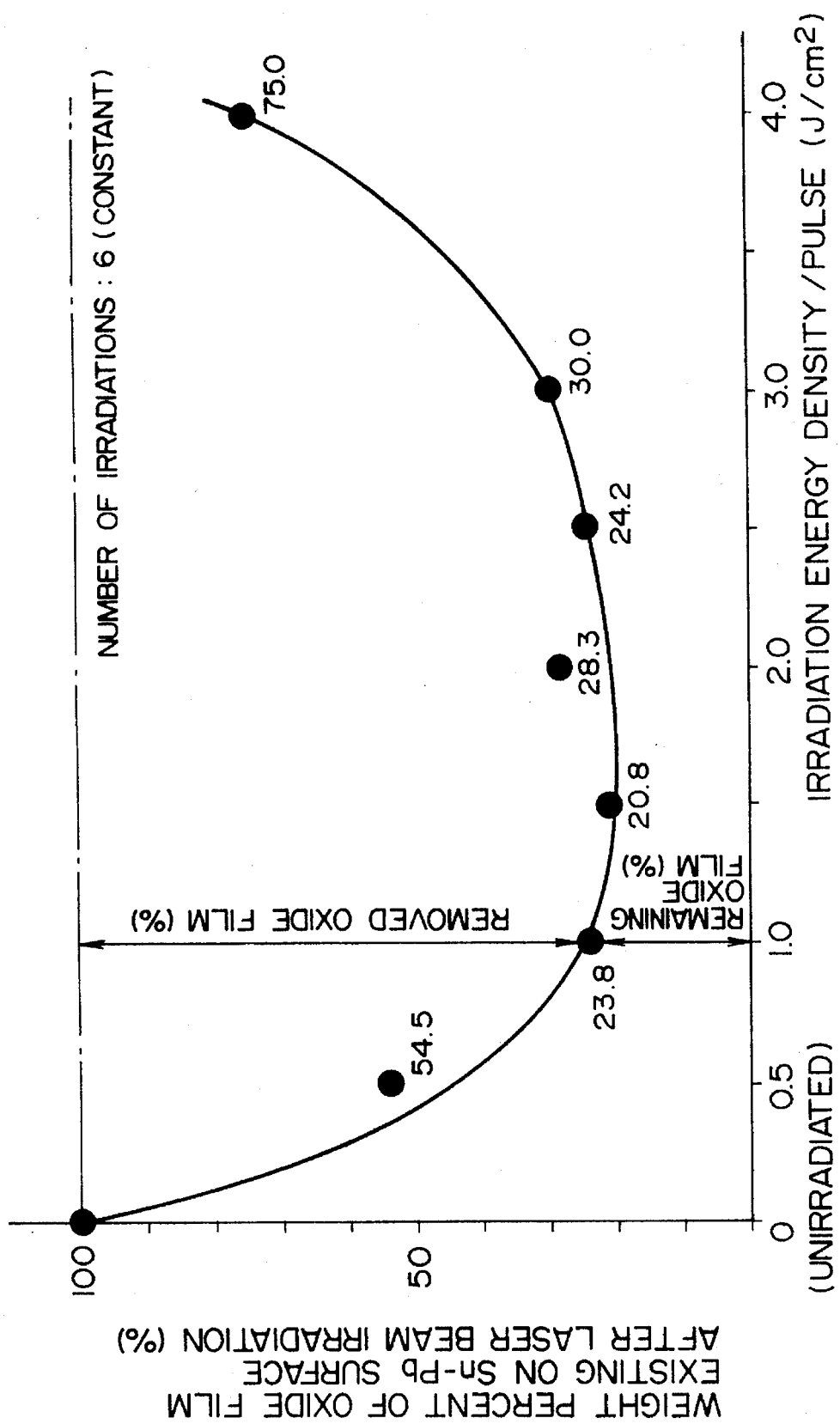
FIG. 7 is a diagram showing a relationship between the weight percentage (wt. %) of oxide film existing on an Sn—Pb solder surface after constant 6 runs of irradiation with a laser beam onto the same region of the Sn—Pb surface as plotted on the ordinate and the energy density per pulse (J/cm$^2$) of the laser beam used for the irradiation as plotted on the abscissa.

FIG. 7 is a diagram showing a relationship between the weight percentage (%) of existing oxide film existing on the Sn—Pb surface after 6 turns of irradiation with a laser beam onto the same region of the Sn—Pb surface on the basis of the oxide film on the surface before the irradiation as 100, as plotted on the ordinate, and the laser beam energy density (J/cm$^2$) per pulse as plotted on the abscissa, from which it is evident that the weight percentage of existing oxide film after the irradiation of the laser beam in a range of energy density of 0.5 J/cm$^2$ to 4.0 J/m$^2$ is smaller than that before the irradiation, and above all a laser beam having an energy density of 1.5 J/cm$^2$ is preferable.

The weight percentage of oxide film on the ordinate of FIG. 7 is based on an oxygen concentration determined by energy dispersive X-ray spectroscopy (EDX).

Figure 8:
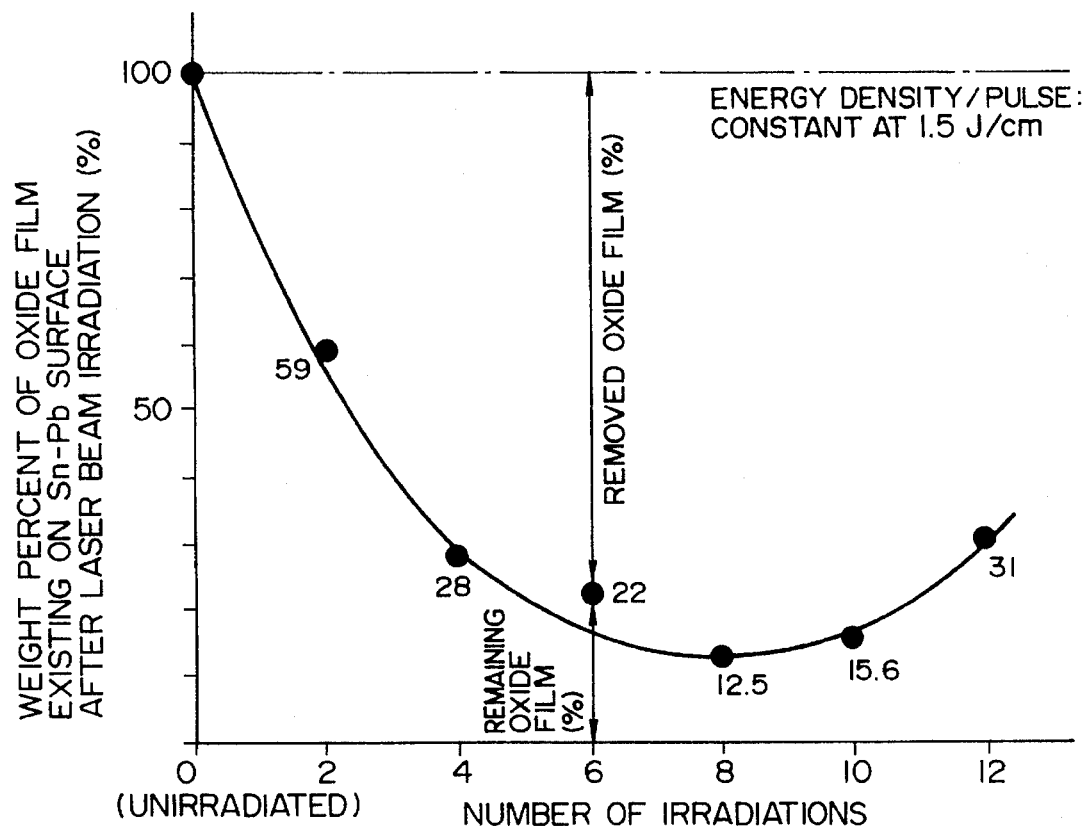
FIG. 8 is a diagram showing a relationship between the weight percentage (wt. %) of oxide film existing on an Sn—Pb solder surface after irradiation with a laser beam as plotted on the ordinate and number of irradiation runs onto the same region of the solder metal surface, as plotted on the abscissa, when the energy density is kept constant at 1.5 J/cm$^2$.

FIG. 8 shows a relationship between the weight percentage (%) of oxide film existing on the Sn—Pb surface after irradiation with a laser beam on the basis of the oxide film existing on the surface before the irradiation as 100, as plotted on the ordinate, and the number of irradiation runs with a laser beam having a constant energy density per pulse of 1.5 J/cm$^2$ onto the same region of the metal surface, as plotted on the abscissa, from which it is evident that the weight percentage of oxide film existing on the Sn—Pb surface becomes a minimum by about 8 runs of the irradiation. That is, the weight percentage of oxide film existing on the Sn—Pb surface becomes a minimum by 8 runs of irradiation of a laser beam having a constant energy density of 1.5 J/cm$^2$ and the wettability of solder 3a or solder bump 3b can be improved thereby.

Figure 9:
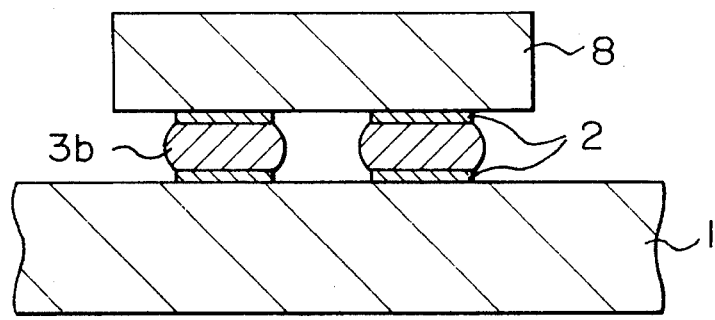
FIG. 9 is a vertical cross-sectional view showing an embodiment of an electronic device bonded by soldering in Example 1 of the present invention.

FIG. 9 is a vertical cross-sectional view showing essential parts of semiconductor device structure comprising an integrated circuit (LSI) 8 bonded to a ceramic substrate 1 by soldering through metallized layers 2 formed as overlayers on both surfaces of the integrated circuit and the ceramic substrate and through solder bumps 3b, from whose surfaces an oxide film has been removed according to the present process of Example 1, in a flux-free state.

Figure 10:
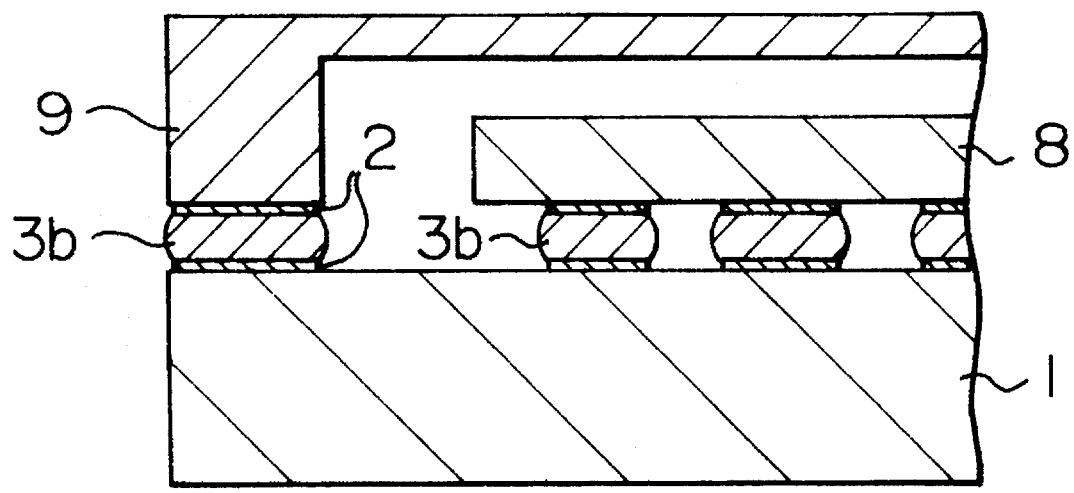
FIG. 10 is a vertical cross-sectional view showing another embodiment of an electronic device bonded by soldering in Example 1 of the present invention.

FIG. 10 is a vertical cross-sectional view of the essential part of seal cap 9 bonded to the semiconductor device structure as shown in FIG. 9 by soldering through solder bumps 3b, from whose surfaces an oxide film has been removed according to the present process of Example 1, in a flux-free state.

Example 2

Figure 11:
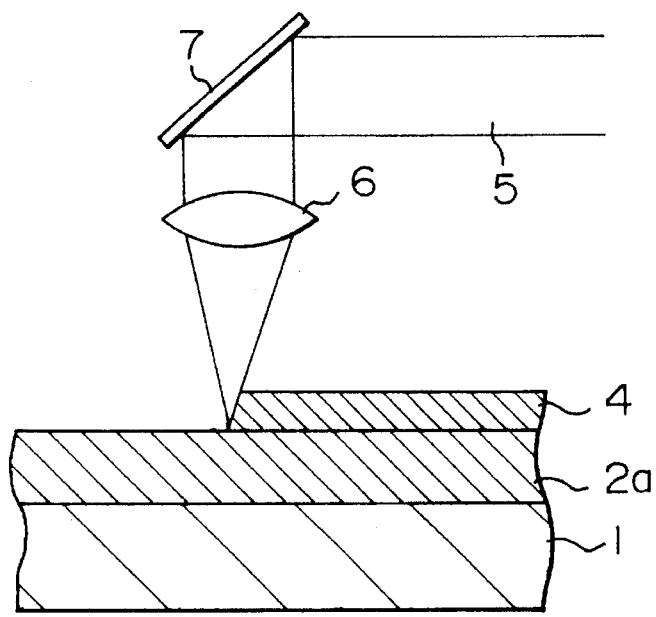
FIG. 11 is a vertical cross-sectional view explaining the present process for metal surface treatment according to Example 2 of the present invention.

FIG. 11 is a vertical cross-sectional view explaining the present process for metal surface treatment according to Example 2 of the present invention, where an oxide film 4 (and residues of organic matters, carbon, etc., if any) is removed from the surface of a nickel (Ni) layer or nickel alloy layer 2a formed as an overlayer on a ceramic substrate 1.

Generally, nickel (Ni) layer or nickel alloy layer 2a is liable to undergo oxidation, and thus an oxide film 4 is easily formed on the surface of nickel (Ni) layer or nickel alloy layer.

The oxide film 4 can be removed from the surface of nickel layer or nickel alloy layer 2a by irradiation of the surface of the layer 2a with a laser beam 5 reflected on a mirror 7 and passing through a lens 2.

Figure 12:
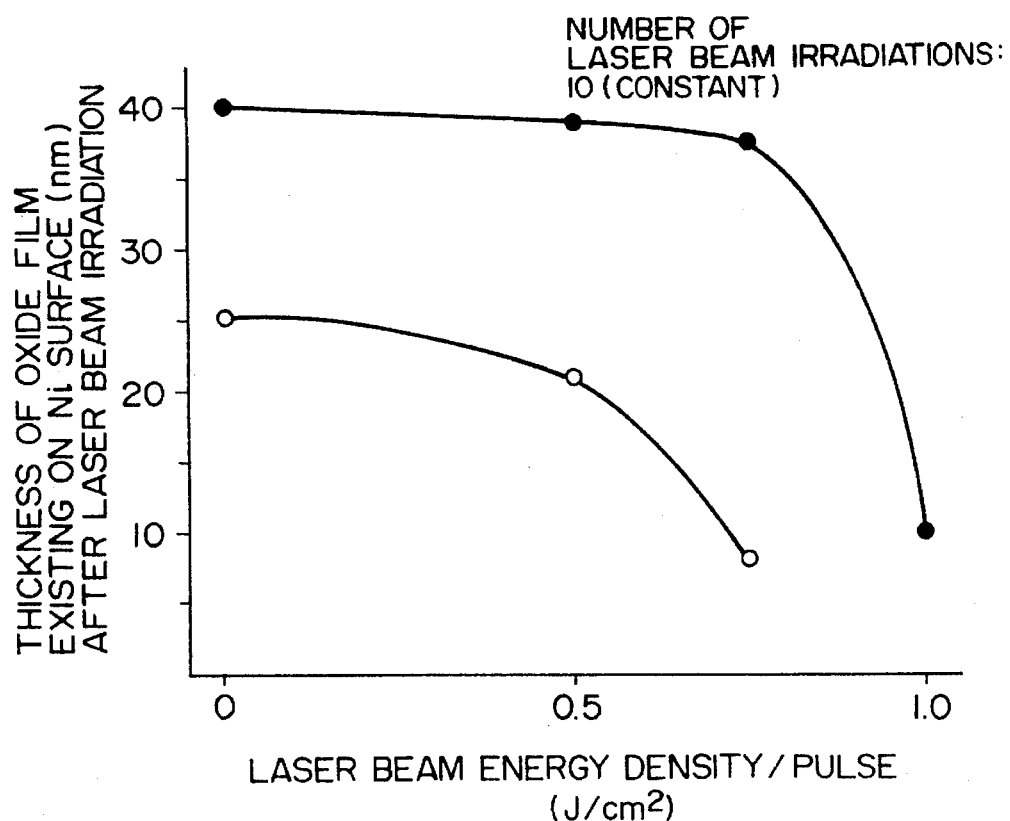
FIG. 12 is a diagram showing a relationship between the thickness (nm) of oxide film existing on the surface of a nickel layer as plotted on the ordinate and the laser beam energy density (J/cm$^2$) as plotted on the abscissa, while setting the number of laser beam irradiation runs onto the same region of the nickel layer to constant 10 according to Example 2 of the present invention.

FIG. 12 shows a relationship between the thickness (nm) of oxide film 4 existing on the surface of nickel layer 2a after 10 runs of irradiation with a laser beam 5 as plotted on the ordinate and the energy density (J/cm$^2$) per pulse of laser beam 5 per unit area as plotted on the abscissa. That is, the number of irradiation with laser beam 5 onto the same region of the nickel layer 2a was set to constant 10 runs. It is evident from FIG. 12 that the oxide films 4 having different initial thicknesses (40 nm and 25 nm, as indicated by black dots and white dots, respectively) can be removed with increasing energy density of the laser beam 5.

Figure 13:
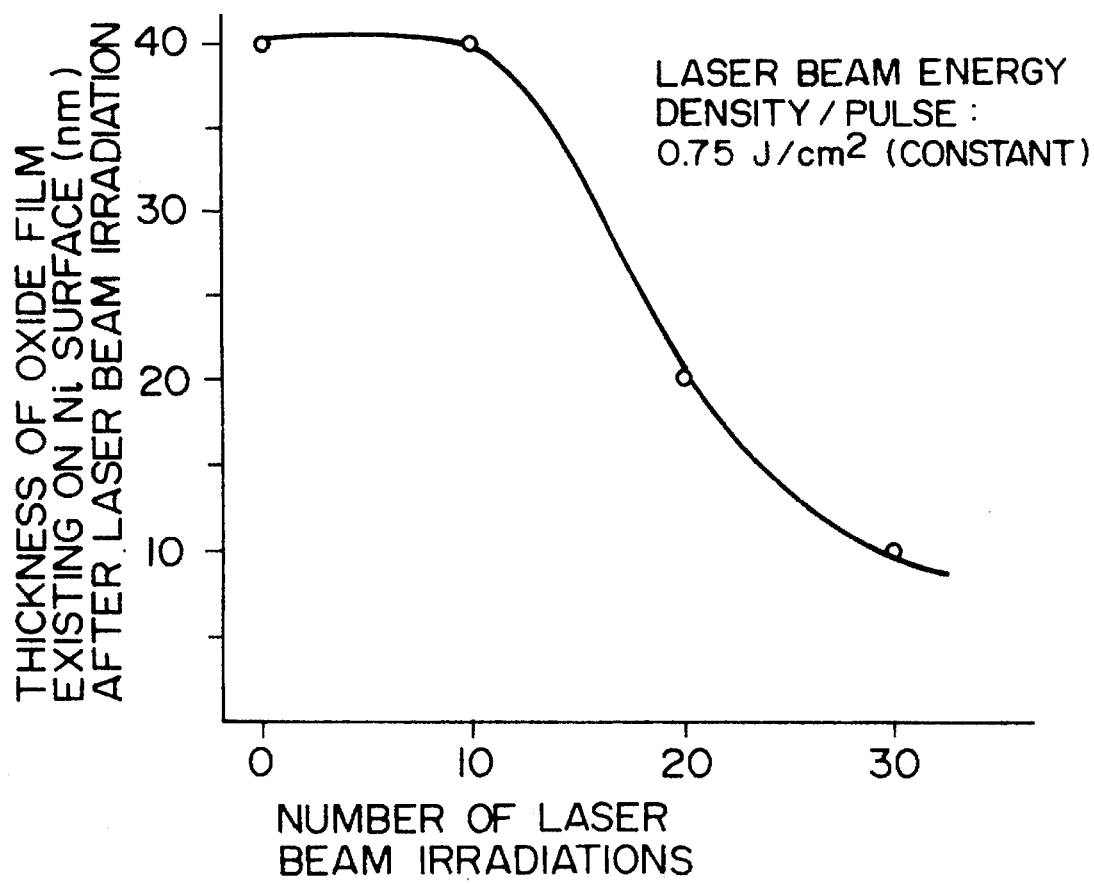
FIG. 13 is a diagram showing a relationship between the thickness (nm) of an oxide film existing on the surface of nickel layer as plotted on the ordinate and the number of laser beam irradiation runs onto the same region of the nickel layer as plotted on the abscissa, while setting the laser beam energy density to constant 0.75 (J/cm$^2$) according to Example 2 of the present invention.

FIG. 13 shows a relationship between the thickness (nm) of oxide film 4 existing on the surface of nickel layer 2a after irradiation of laser beam 5 having a constant energy density of 0.75 J/cm$^2$ per pulse as plotted on the ordinate and the number of laser beam irradiation run onto the same region of nickel layer 2a as plotted on the abscissa. That is, the energy density of laser beam 5 was set to constant 0.75 J/cm$^2$. It is evident from FIG. 13 that the thickness of oxide film decreases with increasing number of laser beam irradiation runs.

Example 3

Figure 14:
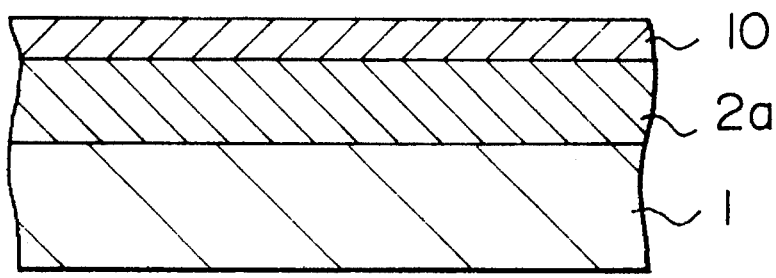
FIG. 14 is a vertical cross-sectional view explaining the present process applied to making of electronic devices according to Example 3 of the present invention.

FIG. 14 is a cross-sectional view showing essential parts of electronic device such as a semiconductor integrated circuit (LSI), etc. to which the present invention is applied according to Example 3.

Electronic device shown in FIG. 14 is made as follows; an oxide film (and residues of organic matters, carbon, etc., if any) is removed from the surface of nickel (Ni) layer or nickel alloy layer 2a formed as overlayer on a ceramic substrate 1 according to the present process for metal surface treatment as shown in Examples 1 and 2, and then a plating layer 10 is formed on the resulting surface-treated, i.e. cleaned nickel layer or nickel alloy layer 2a by electroplating, electroless plating or substitution plating, where a plating material is generally gold (Au) to prevent reoxidation of the cleaned nickel layer or nickel alloy layer. That is, according to the embodiment of Example 3, an oxide film (and residues of organic matters, carbon, etc., if any) is removed from the surface of a nickel (Ni) layer or nickel alloy layer 2a as a metallized layer and a plating layer 10 is formed on the resulting cleaned metallized layer 2a to prevent reoxidation of the resulting cleaned metallized layer 2a.

Figure 15:
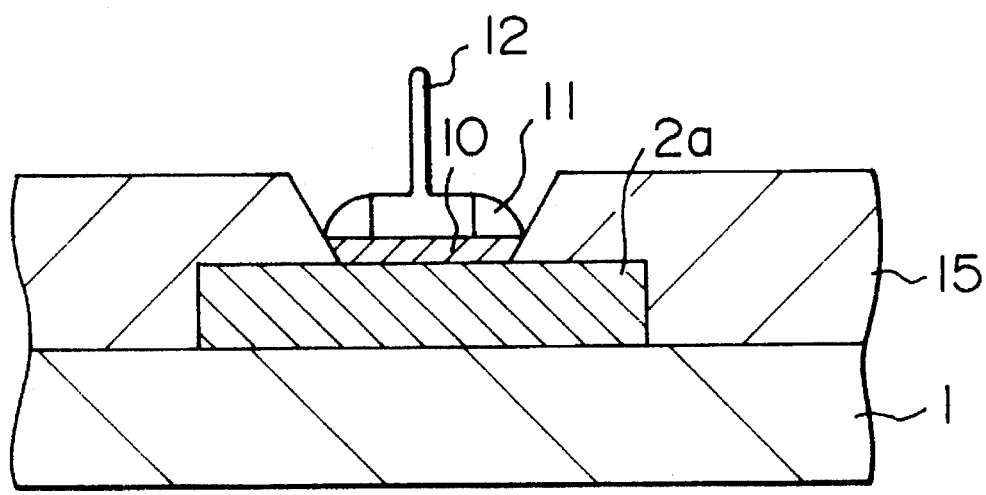
FIG. 15 is a vertical cross-sectional view showing an electronic device to which the reoxidation-preventing means is applied according to Example 3 of the present invention.

FIG. 15 is a vertical cross-sectional view showing essential parts of the structure of an electronic device, to which a reoxidation-preventing means is specifically applied according to the embodiment of Example 3. Where a nickel (Ni) layer or nickel alloy layer 2a is formed as a metallized layer partly on the surface of a ceramic substrate 1; an organic insulating layer 15 is formed entirely on the surfaces of the metallized layer 2a and the ceramic substrate 1; a hole is formed through the organic insulating layer 15 to expose the nickel (Ni) layer or nickel alloy layer 2a; an oxide film (and residues of organic matters, carbon, etc., if any) is removed from the exposed surface of the metallized layer 2a according to the present process for metal surface treatment shown in Examples 1 and 2; then a plating layer 10 for preventing reoxidation of the metallized layer 2b is formed on the resulting cleaned metallized layer 2b; and an input/output (I/O) pin 12 to an electronic device is fixed to the plating layer 10 by a solder or soft solder 11.

Electrical connection between the input/output (I/O) pin 12 and the ceramic substrate 1 of electronic devices such as semiconductor integrated circuits (LSI), etc. can be improved by removing the oxide film 4 (and the residues of organic matters, carbon, etc. if any) from the surface of nickel layer or nickel alloy layer 2a by irradiation with a laser beam 5, as shown in FIGS. 1 and 11, and then forming a plating layer 10 for preventing the reoxidation on the resulting cleaned metallized layer 2a according to the present invention. Within about one week after the removal of oxide film 4, (and the residues, if any) from the surface of the metallized layer 2a by irradiation with the laser beam 5, the input/output (I/O) pin 12 to the electronic device can be electrically connected directly to the metallized layer 2a on the ceramic substrate 1 by the solder or soft solder 11 without using the plating (e.g. Au plating) layer 10 for preventing the reoxidation therebetween.

Figure 16:
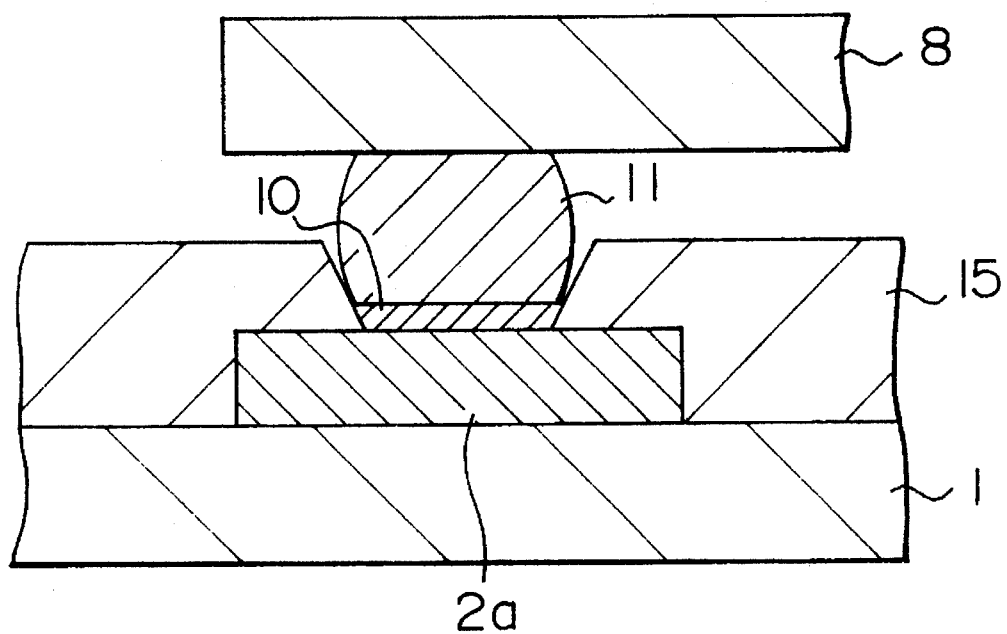
FIG. 16 is a vertical cross-sectional view showing electrical connection between the electronic device and a nickel (Ni) layer or a nickel alloy layer on a ceramic substrate, bonded directly by a solder or a soft solder without using any input/output (I/O) pin shown in FIG. 15.

FIG. 16 is a vertical cross-sectional view showing essential parts of structure of direct electrical connection between the electronic device 8 and the metallized layer 2a on the ceramic substrate 1 by a solder or soft solder 11 without using the input/output (I/O) pin 12 as shown in FIG. 15.

In the foregoing embodiments of the present invention, it is not necessary to use a flux, etc.

Example 4

Figure 17A:
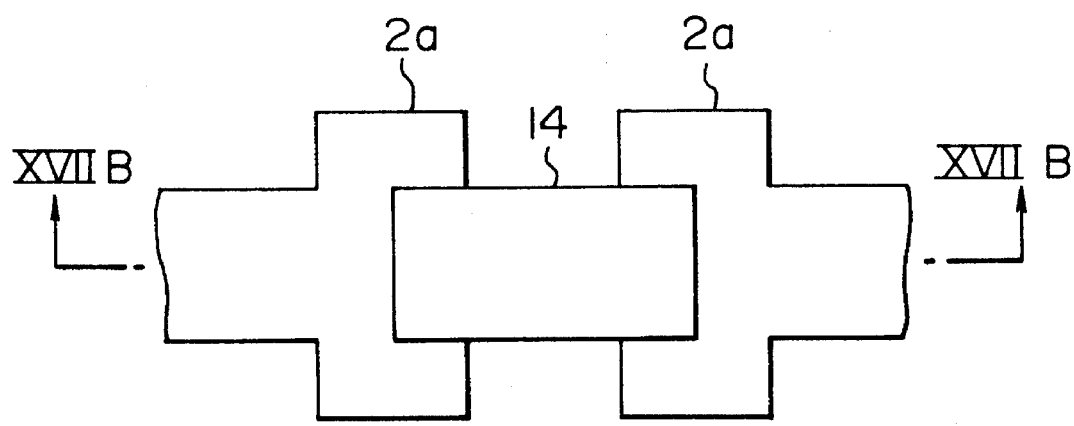
FIGS. 17A and 17B are a plan view and a vertical cross-sectional view along the line A—A of FIG. 17A, respectively, showing the present process applied to making of an electronic device according to Example 4 of the present invention.
Figure 17B:
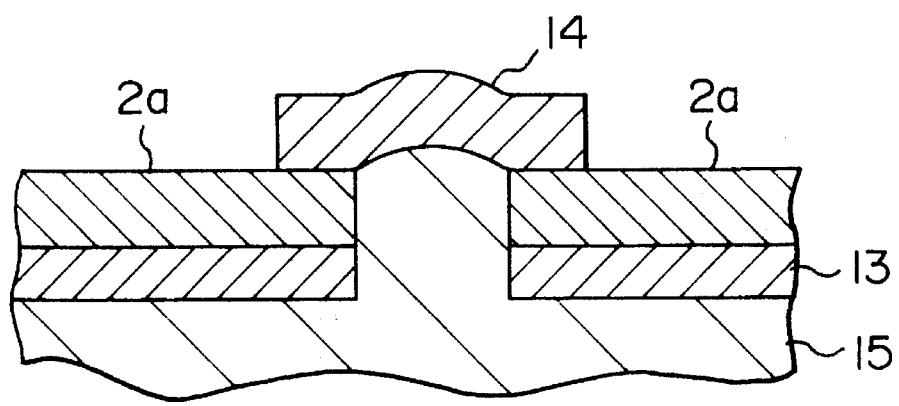

FIGS. 17A and 17B are a plan view and a vertically cross-sectional view along the line A—A of FIG. 17A, respectively, of essential parts of an electronic device such as a semiconductor integrated circuit, etc. to which the present invention is applied according to Example 4, where a metal film 13 having a good adhesion to an organic insulating layer 15, for example, chromium (Cr) or titanium (Ti) layer, is formed as an overlayer on the organic insulating layer 15; a nickel (Ni) layer or nickel alloy layer 2a is formed as a metallized overlayer on the surface of the metal film 13; an oxide film (and residues of organic matters, carbon, etc. if any) is removed from the surface of the metallized layer 2a by irradiation with a laser beam according to the process for metal surface treatment of Examples 1 and 2; and then an gold (Au) ribbon or wire 14 is bonded to the cleaned metallized layer 2a by ultrasonic welding.

Generally, it is difficult to conduct bonding between the gold ribbon or wire 14 and the metallized layer 2a due to the presence of the oxide film (and the residues of organic matters, etc., if any) on the surface of the metallized layer 2a. By removing the oxide film (and the residues of organic matters, etc., if any) from the surface of the metallized layer 2a according to the process for metal surface treatment of Examples 1 and 2, good bonding can be obtained therebetween.

In the foregoing Examples, the metals to be surface-treated according to the present invention are exemplified by nickel (Ni) layer or nickel alloy layer 2a and solder layer 3a or solder bumps 3b, but are not limited only thereto. That is, the present invention is applicable to any metals from whose surfaces it is necessary to remove oxide films (and residues of organic matters, etc., if any) where an appropriate energy level of laser beam must be selected in view of properties of metals to be surface treated.

In the foregoing Examples, the laser beam is exemplified by a pulse laser beam. With such a control means as not to melt the metal itself, a laser beam having a long wavelength such as a $CO_2$ laser, etc. can be used and the similar effects to those of pulse laser beam can be obtained by continuous irradiation.

Melting of metal on the surface sometimes occurs by laser irradiation, but such melting is permitted so long as it occurs only for a short duration.

The present invention has been described in detail, referring to Examples, but is not limited only to the embodiments shown in Examples and can be modified to various degrees, if the modification is not deviated from the spirit and scope of the present invention.

What is claimed is:

1. A process for a solder treatment, which comprises irradiating a surface of a solder bump or layer bonded to a ceramic substrate with a laser beam of lower energy level than energy capable of changing the solder surface structure, thereby cleaning the surface of said solder, and bonding an integrated circuit to said cleaned solder surface, said solder being comprised of Sn—Pb.

2. A process for making an electronic device, by connecting a part to a circuit wiring substrate by a solder, which comprises irradiating the solder with a laser beam, thereby cleaning the surface of the solder and then heating and melting the solder, thereby connecting the part to the circuit wiring substrate.

3. A process according to claim 2, wherein the part is a semiconductor integrated circuit.

4. A process according to claim 2, wherein the part is a seal cap of a semiconductor integrated circuit.

5. A process according to claim 2, wherein the circuit wiring substrate is a ceramic substrate.

6. A process for making an electronic device by connecting an LSI to a circuit substrate through a solder bump as a terminal, which comprises irradiating the solder bump with a laser beam, thereby cleaning the surface of the solder bump and then heating and melting the solder bump, thereby connecting the LSI to the circuit substrate.

7. A process according to claim 6, wherein the circuit substrate is a ceramic substrate.

8. A process according to claim 2, wherein the laser beam has a pulse span of not more than 1 microsecond.

9. A process according to claim 2, wherein the laser beam has a wavelength of 150 nm to 400 nm.

10. A process according to claim 2, wherein the laser beam has an energy density of 0.5 $J/cm^2$ to 4.0 $J/cm^2$.

* * * * *